United States Patent
Bang et al.

(10) Patent No.: US 6,380,556 B1
(45) Date of Patent: Apr. 30, 2002

(54) TEST STRUCTURE USED TO MEASURE METAL BOTTOM COVERAGE IN TRENCHES AND VIAS/CONTACTS AND METHOD FOR CREATING THE TEST STRUCTURE

(75) Inventors: David Bang, Palo Alto; Takeshi Nogami, Sunnyvale; Guarionex Morales, Santa Clara; Shekhar Pramanick, Fremont, all of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/619,292

(22) Filed: Jul. 19, 2000

Related U.S. Application Data

(62) Division of application No. 09/080,917, filed on May 18, 1998, now Pat. No. 6,127,193.

(51) Int. Cl.⁷ ............................................. H01L 29/40
(52) U.S. Cl. ......................... 257/48; 257/207; 438/18; 438/10
(58) Field of Search ........................... 438/10, 108, 18; 257/48, 207, 716

(56) References Cited

U.S. PATENT DOCUMENTS

| | | | | |
|---|---|---|---|---|
| 5,691,648 A | * | 11/1997 | Cheng | 324/716 |
| 5,768,681 A | * | 6/1998 | Pasch | 438/108 |
| 5,821,624 A | * | 10/1998 | Pasch | 257/776 |
| 5,900,645 A | | 5/1999 | Yamada | |
| 5,963,784 A | | 10/1999 | Bothra et al. | |

OTHER PUBLICATIONS

Paul R. Besser et al, Article entitled, "Polycrystalline Then Films—Structure, Texture, Properties and Applications III", 1997.
Robert Havermann et al., Article entitled, "Advanced Metallization and Interconnect Systems for ULSI Applications in 1996", 1996.

* cited by examiner

*Primary Examiner*—John F. Niebling
*Assistant Examiner*—André C Stevenson
(74) *Attorney, Agent, or Firm*—Eschweiler & Associates, LLC

(57) ABSTRACT

A test structure used to measure metal bottom coverage in semiconductor integrated circuits. The metal is deposited in etched trenches, vias and/or contacts created during the integrated circuit manufacturing process. A predetermined pattern of probe contacts are disposed about the semiconductor wafer. Metal deposited in the etched areas is heated to partially react with the underlying and surrounding undoped material. The remaining unreacted metal layer is then removed, and an electrical current is applied to the probe contacts. The resistance of the reacted portion of metal and undoped material is measured to determine metal bottom coverage. Some undoped material may also be removed to measure metal sidewall coverage. The predetermined pattern of probe contacts is preferably arranged in a Kelvin or Vander Paaw structure.

8 Claims, 3 Drawing Sheets

TEST STRUCTURE USED TO MEASURE METAL BOTTOM COVERAGE IN TRENCHES AND VIAS/CONTACTS AND METHOD FOR CREATING THE TEST STRUCTURE

This application is a division of application Ser. No. 09/080,917, filed May 18, 1998 now U.S. Pat. No. 6,127,193.

BACKGROUND OF THE INVENTION

This invention relates to test structures used in the fabrication of semiconductor integrated circuits, and more particularly, to test structures used to measure metal bottom coverage in semiconductor integrated circuits and a method for creating such test structures.

Test structures are known in the art and are commonly used in the manufacture of semiconductor integrated circuits. Various types of test structures are used in the semiconductor industry in an effort to improve process precision, accuracy and to simplify manufacturing of an integrated circuit wafer. Test structures are also employed to help shrink the sizes of integrated circuits and the size of individual electrical elements within integrated circuits. They are also used in an effort to help improve and increase the processing speed of these devices.

One problem commonly encountered in the manufacture of integrated circuits is measuring the amount of metal deposited during the manufacturing process. Specifically, metal may be deposited at the bottom or lower level of a trench structure, or a contact or via structure, that is created during the manufacture of the integrated circuit. These trenches, vias and contacts are typically created by etching through a particular layer previously deposited during the manufacturing process. Metal and other materials are then deposited within these trenches, vias and/or contacts in order to establish electrical contact between different layers of the semiconductor sandwich.

In order to monitor and improve the manufacture of integrated circuits, it may be important to measure the thickness or amount of metal deposited in the bottoms of these etched structures. The conventional way to measure bottom coverage is to cross section a sample integrated circuit wafer and take Scanning Electron Microscope (SEM) or Transmission Electron Microscope (TEM) micrographs. Sample preparation for SEM and TEM is tedious and performing wafer maps with these techniques is impractical. This process is also time consuming and by nature destructive of the particular integrated circuit tested.

Other known test structures used in the manufacture of integrated circuits include conventional Kelvin structures and line resistance structures. These other techniques, however, cannot successfully be used to measure metal coverage in the bottom of trenches, vias and/or contacts. In addition, the current qualification method used to measure film deposition uniformity is to create a 4-point probe wafer map of deposited metal over a flat wafer. However, unlike measuring surface uniformity across the wafer surface, bottom coverage uniformity may be unrelated to top surface uniformity, and the area of greatest concern in semiconductor manufacturing is the amount of material deposited at the bottom of topography features.

What is lacking in the art is a test structure for measuring the amount of metal deposited in the bottom of etched structures quickly. The property of Titanium Silicide reacting and having high etch selectivity as compared to Ti alone could be used to pattern such structures. With such a non-invasive technique for measuring metal coverage, automated tests may be performed to measure metal bottom coverage unlike the previously known cross sectioning techniques. As a result, many more integrated circuits can be monitored and/or tested during manufacture in order to improve device yield and other operating parameters.

BRIEF SUMMARY OF THE INVENTION

In view of the above, a test structure for measuring metal bottom coverage, and a method for creating the test structure, is provided. According to the method of the invention, a layer of undoped material is deposited according to a predetermined test structure over a first isolation layer. A second isolation layer is deposited over the undoped material. The second isolation layer is then etched in a predetermined manner. A layer of metal is deposited over the exposed areas of the undoped material. Heat is then applied to the metal layer. A current is next applied to the predetermined test pattern, and the electrical resistance of the test pattern is measured.

According to the test structure of the invention, a plurality of probe contacts are deposited on a layer of undoped material according to a predetermined test pattern. At least one area of exposed undoped material is disposed between a first and a second probe contact. A metal layer is deposited over the at least one exposed area of undoped material. A layer of reacted metal and undoped material is disposed at the at least one exposed area of undoped material.

Through the electronic measurement of metal bottom coverage, many wafer samples may be measured quickly and repeatedly. Unlike SEM or TEM cross sectional analysis, wafer maps may be easily produced and used for in-line measurements and equipment qualification. Moreover, electrical measurements have the ability to be repeated unlike the previously known cross sectioning tests. The step coverage of metals at the bottom of a trench structure may also be more easily assessed. The invention also improves the precision and accuracy, and simplifies, the manufacturing of integrated circuits.

These and other features and advantages of the invention will become apparent upon a review of the following detailed description of the presently preferred embodiments of the invention, taken in conjunction with the appended drawings.

DETAILED DESCRIPTION OF THE PRESENTLY PREFERRED EMBODIMENTS OF THE INVENTION

Figure 1:
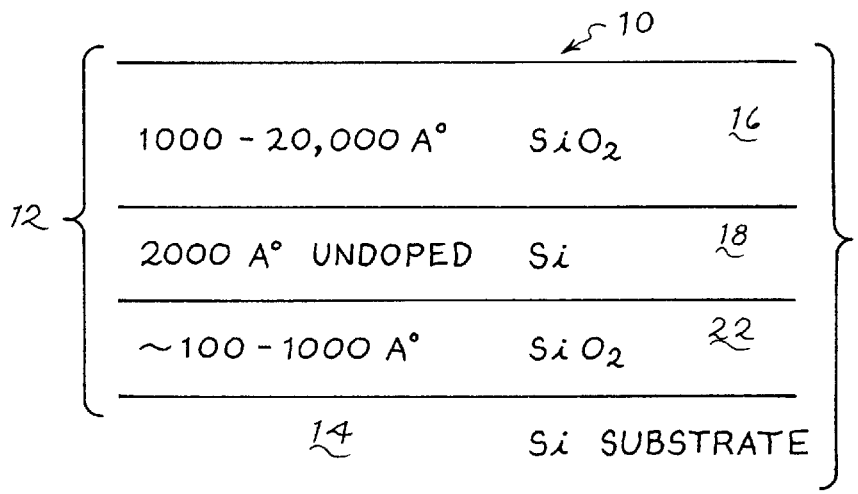
FIG. 1 shows a cross-sectional view of a test structure made according to one presently preferred embodiment of the invention.

Referring now to the drawings, where like reference numerals refer to like elements throughout, one presently preferred test structure 10 used to measure the amount of metal deposited on the bottom of trenches and vias/contacts (bottom coverage) is shown in FIG. 1. The measurement is preferably performed electrically or by profileometer, which is quick and allows wafer mapping. This technique is designed to measure the amount of material on the bottom of topography features.

As shown in FIG. 1, the test structure 10 is constructed from layers 12 of deposited films over a substrate 14. In one preferred embodiment of the invention, in order to ensure electrical isolation for the test structure 10, a thin oxide layer 22 is deposited between the substrate 14 and an undoped silicon layer 18. As those skilled in the art will appreciate, although undoped silicon is the presently preferred medium for the test structure, lightly or partially doped materials can also be employed without departing from the spirit and scope of the invention. A dielectric layer 16 is then deposited over the undoped silicon layer 18. Nominal ranges for film thicknesses are:

| Film Thickness | |
|---|---|
| Oxide layer 22 | 100–1000 Angstrom |
| Undoped layer 18 | 2000 Angstrom |

Dielectric layer 16—1000–20,000 Angstrom

As those skilled in the art will appreciate, $SiO_2$ is the preferred dielectric material, but other insulators such as $Si_3N_4$, or spin on glass, may be used without departing from the spirit and scope of the invention.

Figure 2:
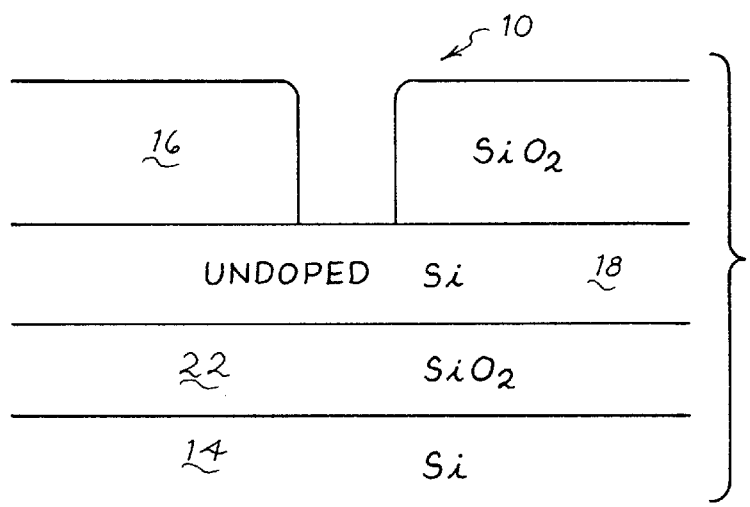
FIG. 2 shows the etching of a trench, contact or via structure in a layer of silicon dioxide.
Figure 7:
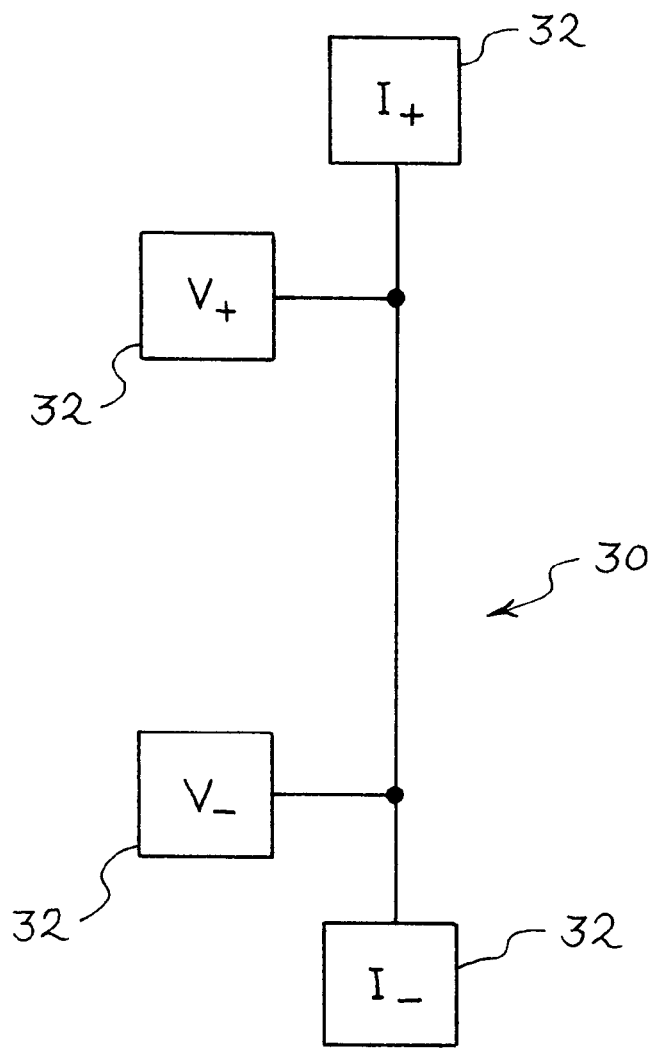
FIG. 7 presents a top plan view of one presently preferred mask pattern for the test structure shown in FIG. 1.

Referring to FIG. 2, the $SiO_2$ dielectric layer 16 is preferably patterned using standard semiconductor photolithography and $SiO_2$ etching techniques. A sample test pattern is shown in FIG. 7, but other test patterns are possible (see below). As shown in FIG. 2, in one embodiment, the etch is preferably stopped at the undoped silicon layer 18. Alternatively, a portion of the undoped silicon layer 18 may be etched as well (about 1000–3000 Angstrom) in order to also study bottom sidewall coverage.

Figure 3:
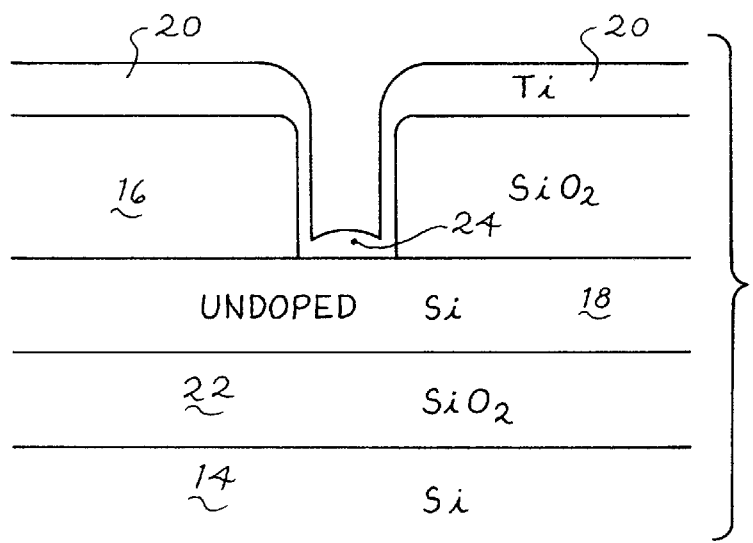
FIG. 3 shows the deposition of a metal layer within the structure shown in FIG. 2.

Referring to FIG. 3, the metal layer 20 to be studied is deposited within the $SiO_2$ dielectric layer 16. The metal layer 20 may be Co, Ti, Cu, Ni, or any other metal which reacts with silicon. Deposition techniques that may be used include either sputter or evaporation Physical Vapor Deposition (PVD), Long Throw PVD, Collimated PVD, Chemical Vapor Deposition, and Ionized Metal Deposition. Nominal deposited film thicknesses are preferably between 100 and 1000 Angstrom.

Figure 4:
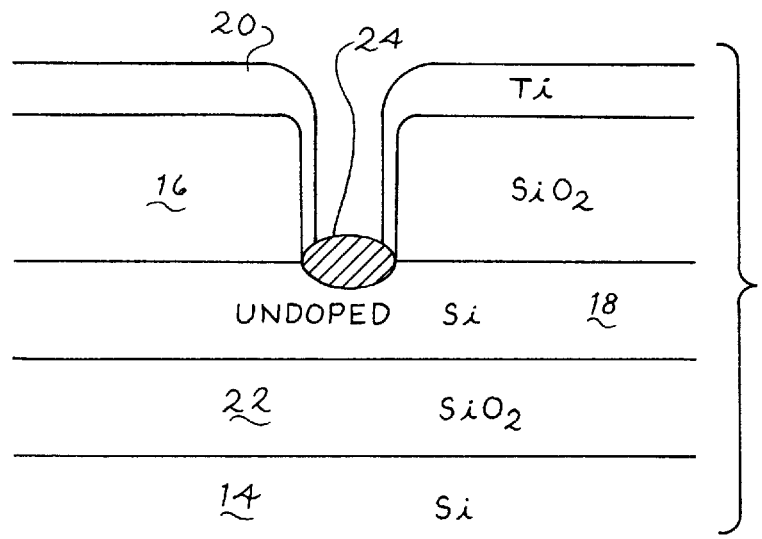
FIG. 4 illustrates the interaction between the metal layer deposited in FIG. 3 and the underlying layer of undoped silicon.

Once the metal layer 20 is deposited, the wafer (not shown) is raised to a high temperature which causes the metal layer 20 to react with the Si dielectric material 18. Preferably, the nominal temperature should be 650° Celsius applied for 60 seconds. Only the metal 24 contacting the Si dielectric 16 reacts, so only the metal 24 at the bottom 26 of the feature becomes $TiSi_2$, as shown in FIG. 4.

Figure 5:
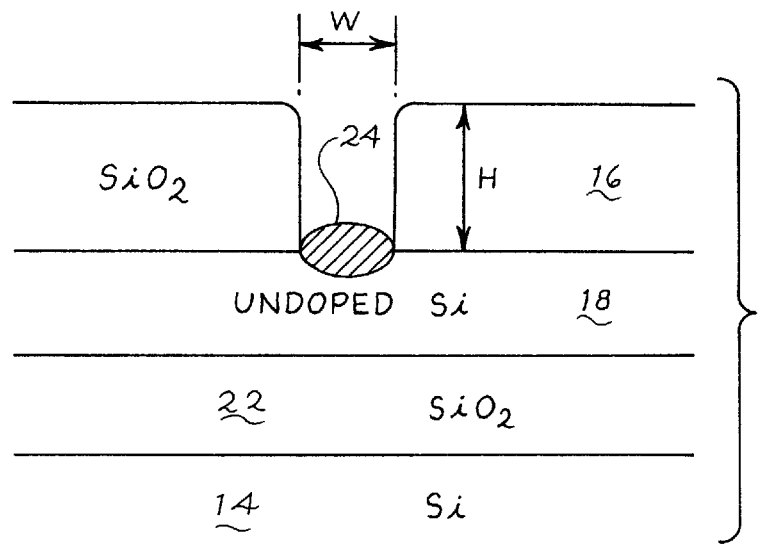
FIG. 5 shows the remaining reacted metal after heating and etching away the unreacted metal.

The remaining metal layer 20 is selectively etched using standard semiconductor etchants leaving the structure shown in FIG. 5. In the presently preferred embodiment, the $SiO_2$ dielectric layer 16 is not etched, but an etchant which etches the $SiO_2$ layer 16 may alternatively be used. One preferred etchant that will etch Ti and $SiO_2$ is HF acid. An alternate etchant suitable to etch deposited (Cu is $HNO_3$. Because undoped polycrystalline Si has very high resistivity, the $TiSi_2$ 30 is now electrically isolated and patterned, as shown in FIG. 5.

Figure 6:
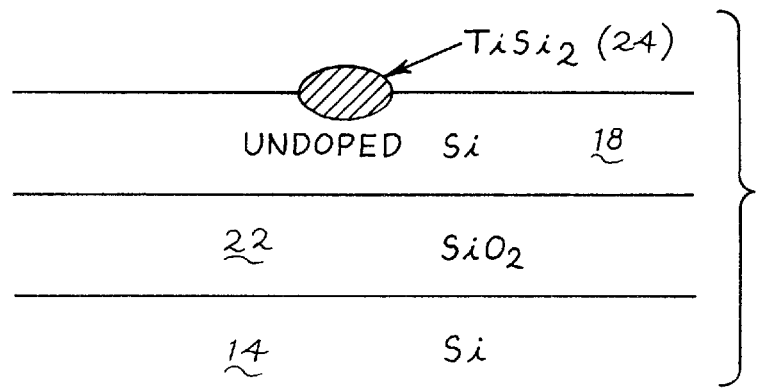
FIG. 6 shows one alternate embodiment of the invention where a portion of silicon dioxide is also removed from the trench, via or contact structure.

Alternatively, if the $SiO_2$ layer 16 is stripped in addition to the Ti metal layer 20 as shown in FIG. 6, then a profileometer or Atomic Force Microscope could be used to measure the actual profile of the $TiSi_2$ line 24. In this embodiment, an alternative mask pattern (not shown) of an array of contacts/vias may be used to measure the amount of deposited metal in the bottom of contacts/vias.

A top plan view of the presently preferred mask pattern 30 suitable for making the aforementioned electrical measurement is shown in FIG. 7. In the preferred embodiment, a conventional Kelvin test structure is used to measure the line resistance of the reacted $TiSi_2$ layer 24. From the line resistance, the amount of metal deposited on the bottom 26 of trenches may be calculated. Those skilled in the art will appreciate that the open pad areas 32 used to make probe contacts do not affect the resistance measurement because a 4-point measurement is made. Because the silicon layer 18 is undoped, the $TiSi_2$ layer 24 is also effectively electrically isolated. The mask pattern 30 shown in FIG. 7 is used to measure the resistance. This novel masking technique creates a Kelvin structure that is used to measure the amount of material on the bottom of structures.

As those skilled in the art will appreciate, other resistance structures may be used without departing from the spirit and scope of the invention. Such structures include strait wire resistance test structures or area test structures.

It is to be understood that a wide range of changes and modifications to the embodiments described above will be apparent to those skilled in the art and are contemplated. It is therefore intended that the foregoing detailed description be regarded as illustrative rather than limiting, and that it be understood that it is the following claims, including all equivalents, that are intended to define the spirit and scope of the invention.

We claim:

1. An integrated circuit test structure comprising:

a plurality of probe contacts deposited on a layer of undoped material according to a predetermined test pattern;

at least one exposed area of undoped material, the at least one exposed area of undoped material disposed between a first and second probe contact;

a metal layer deposited over the at least one exposed area of undoped material; and a layer of reacted metal and undoped material, the layer of reacted metal and undoped material disposed at the at least one exposed area of undoped material.

2. The test structure defined in claim 1, wherein the metal layer comprises titanium.

3. The test structure defined in claim 1, wherein the undoped material comprises silicon.

4. The test structure defined in claim 1, wherein the layer of reacted metal and undoped material comprises titanium silicide.

5. The test structure defined in claim 1, wherein the predetermined test pattern comprises a Kelvin structure.

6. The test structure defined in claim 1, wherein the predetermined test pattern comprises a Vander Paaw structure.

7. The test structure defined in claim 1, wherein the metal layer covers at least a portion of an isolation layer deposited over the layer of undoped material.

8. The test structure defined in claim 4, wherein the isolation layer comprises silicon dioxide.

* * * * *